(12) United States Patent
Watabe et al.

(10) Patent No.: US 6,236,046 B1
(45) Date of Patent: May 22, 2001

(54) INFRARED SENSOR

(75) Inventors: Yoshifumi Watabe, Tondabayashi; Yoshiaki Honda, Soraku-gun; Kouichi Aizawa, Neyagawa; Tsutomu Ichihara, Hirakata, all of (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 09/167,996

(22) Filed: Oct. 7, 1998

(30) Foreign Application Priority Data

Oct. 28, 1997 (JP) .................................................. 9-294746

(51) Int. Cl.[7] .................................................... G01J 1/00
(52) U.S. Cl. ................................... 250/338.1; 250/338.3; 250/332; 250/330; 250/340; 250/342
(58) Field of Search ........................... 250/338.1, 338.3, 250/332, 330, 340, 342

(56) References Cited

U.S. PATENT DOCUMENTS 4,258,260    3/1981    Obara et al. .

5,583,058  * 12/1996   Utsumi et al. ..................... 250/338.3

FOREIGN PATENT DOCUMENTS 61-50232    4/1986   (JP) .

* cited by examiner

*Primary Examiner*—Constantine Hannaher
*Assistant Examiner*—Andrew Israel
(74) *Attorney, Agent, or Firm*—Lynn & Lynn

(57) ABSTRACT

An infrared sensor is formed with a first infrared detecting element for infrared detection disposed in a container through a supporting substrate, and a second infrared detecting element for temperature compensation also disposed in the container to be shielded by the supporting substrate of the first infrared detecting element from incident infrared within the container, while a temperature sensing section of the first infrared detecting element is born in non-contacting state with respect to a supporting part of the substrate for the element, whereby the sensitivity can be remarkably improved with a simpler arrangement while keeping a high precision and inexpensiveness.

21 Claims, 9 Drawing Sheets

INFRARED SENSOR

BACKGROUND OF THE INVENTION

This invention relates to an infrared sensor for detecting infrared in response to thermal variation due to absorption of infrared.

DESCRIPTION OF RELATED ART

Infrared detecting elements for use in the infrared sensors have been generally classified into quantum type and thermal type in accordance with operational principle. While the quantum type infrared detecting element is extremely high in the sensitivity, there have been such problems due to the necessity of using it at lower temperatures with the element itself cooled that the sensor is difficult to handle, manufacturing costs become high, dimensions in a system including means for cooling the element become larger, and so on.

In contrast, the thermal type infrared detecting element is less sensitive than the quantum type but is not required to be cooled and simpler in the structure, and has been utilized widely in various practical ways of use, because of such advantages as low manufacturing costs, minimized dimensions and so on.

The infrared sensors of this type have been disclosed in Japanese Utility Model Laid-Open Publication No. 61-50232 by K. Kitamura et al., and U.S. Pat. No. 4,258,260 by H. Obara et al.

In a typical arrangement of another known thermal type sensor, a first infrared detecting element for infrared detection and a second infrared detecting element for temperature compensation are concurrently disposed in a container comprising a cap and a stem, and an infrared shielding plate for preventing the incidence of infrared onto the second infrared detecting element from occurring is provided at part of front face of an infrared transmitting filter closing an incident window provided in the cap, or the infrared transmitting filter is provided only at a position opposing the first infrared detecting element so that the infrared will not be incident on the second infrared detecting element.

In the above sensor arrangement, however, there is present a space between the second infrared detecting element for the temperature compensation and the infrared shielding plate or the like so that, in order to completely shield the infrared apt to be incident on the second infrared detecting element, it will be necessary that an angle of view of the first infrared detecting element is set, an aperture is provided for allowing the infrared only within the range of the set angle of view to be incident, and an infrared shielding section is provided to be sufficiently larger than the second infrared detecting element for completely shielding the infrared present outside the range of set angle of view. In this case, the incidence of infrared to the first infrared detecting element from a certain direction is caused to be hindered, so that there will arise a problem that the sensitivity may happen to be remarkably varied depending on the direction of incidence of the infrared.

SUMMARY OF THE INVENTION

An object of the present invention is to overcome the foregoing problems and to provide an infrared sensor capable of restraining any deterioration in the detecting precision due to variation in the ambient temperature, only at lower costs required.

According to the present invention, the above object can be attained by means of an infrared sensor wherein first and second infrared detecting elements have respectively a temperature sensing section provided for converting a temperature variation of the section due to incident infrared into an electric detection signal, and the temperature sensing section is disposed in a container having an infrared incident window for enlarging the temperature variation, characterized in that the first infrared detecting element for infrared detection and the second infrared detecting element for temperature compensation are disposed in the container, the temperature sensing section of the first infrared detecting element is supported in non-contacting state with respect to a supporting part of a supporting substrate for the element, the first infrared detecting element is supported by the supporting substrate in opposition to the infrared incident window, and the second infrared detecting element is shielded by the supporting substrate of the first infrared detecting element from the infrared incident. With this arrangement of the infrared sensor, it is enabled to restrain any deterioration in the detecting precision of the infrared due to variation in the ambient temperature without causing any hindrance to the compensation for the ambient temperature nor any increase in the costs, while the second infrared detecting element for the temperature compensation is disposed in the same container as that of the first infrared detecting element.

Other objects and advantages of the present invention shall become clear as the description of the invention advances as detailed with reference to preferred embodiments shown in accompanying drawings.

Figure 1A:
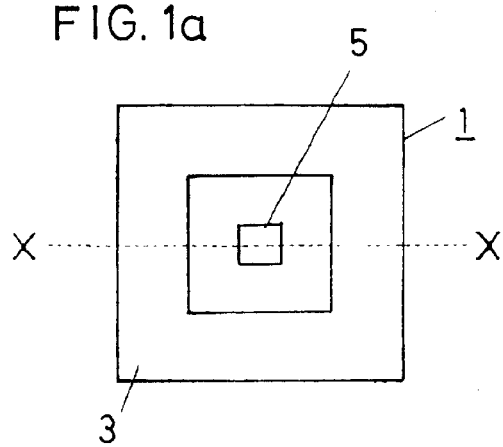
FIG. 1a shows in a plan view an infrared detecting element employed in the infrared sensor according to the present invention.
Figure 1B:
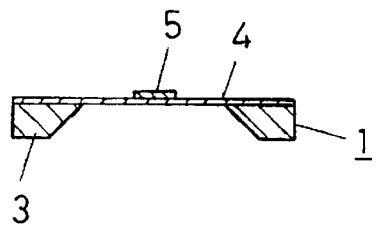
FIG. 1b is a sectioned view of the element of FIG. 1a taken along line X—X.

While the present invention shall now be described with reference to the preferred embodiments shown in the drawings, it should be appreciated that the intention is not to limit the invention only to these aspects and embodiments shown but rather to include all alterations, modifications and equivalent arrangements possible within the scope of appended claims.

DETAILED DESCRIPTION OF THE PREFERRED EMBODIMENTS

In an infrared detecting element 1 employed in the present invention as shown in FIGS. 1a and b, a film section 4 consisting of a dielectric film is constituted by forming the dielectric film on a supporting part 3 consisting, for example, of a Si substrate, and providing in the supporting part 3 a cavity or recess, and a temperature sensing section 5 for absorbing the infrared on the film section 4. Further, a microbridge structure is constituted by providing diaphragm parts or slits in the film section 4. While it is desirable fundamentally that a second infrared detecting element for temperature compensation is prepared in the same structure as that described above of the first infrared detecting element 1 for the infrared detection so that both elements may be employed in an infrared sensor according to the present invention later described, they need not be always the same. Further, the supporting part 3 needs not be limited to the Si substrate, and may be an alumina substrate or the like.

Figure 2:
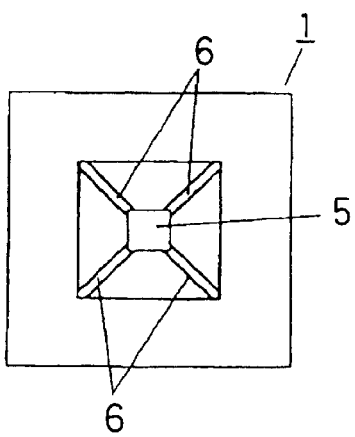
FIGS. 2 and 3 show in similar plan and sectioned views in another aspect of the infrared detecting element employed in the sensor according to the present invention.

The dielectric film is constituted by a film of, for example, SiO, SiN, SiON or the like, whereas the temperature sensing section 5 is of a structure in which such element for grasping temperature variation due to the incidence of infrared as thermistor, thermocouple, thermopile, pyroelectric element or SAW element is provided with electrodes for outputting detection signals, and, as required, the dielectric film of SiO, SiN, SiON or the like is formed thereon. In attaining thereafter a bridging structure, in particular, the microbridge structure at a part of the film section 4 for supporting the temperature sensing section 5 as shown in FIG. 2, the part of the film is subjected to such etching as RIE (reactive ion etching) process for allowing parts of supporting beams 6 of such dielectric film as SiO, SiN, SiON or the like will be left, to form slits. In forming the supporting section in a diaphragm shape, the etching is carried out by means of a SiN-masking or the like formed on the rear surface. In an event where the etching is to be carried out from surface side of the film section 4 to attain a formation of FIG. 3, further, a bored part is formed on lower side of the temperature sensing section 5 by etching the Si substrate 3 through the silts formed in the film section 4. As an etchant, various ones including KOH (potassium hydroxide), EDP (ethylenediamine pyrocatechol), hydrazine, TMAH (tetramethylammonium hydroxide) may be employed, while an optimum one of them should be selected in accordance with such demanded conditions as protection of the temperature sensing section 5, the side from which the etching is made with respect to the film section 4, presence or absence of contact between the etchant and the surface of the temperature sensing section 5, and so on.

Figure 1C:
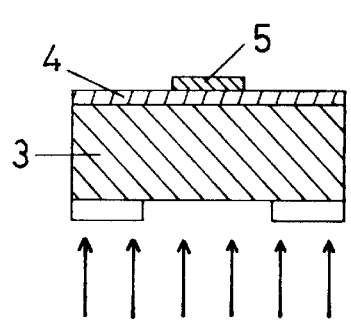
FIGS. 1c to 1e, FIGS. 1f to 1h, FIGS. 1i to 1k and FIGS. 1l to 1o are respectively explanatory views for manufacturing steps in different aspects of the infrared detecting element employed in the present invention.
Figure 1D:
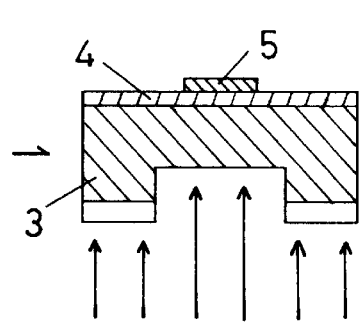
Figure 1E:
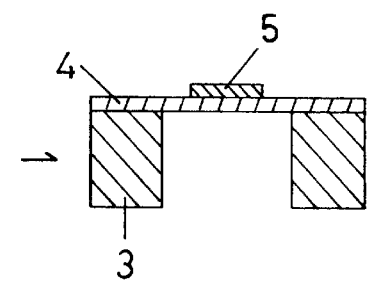

For an arrangement of non-contact support with respect to the supporting part 3, further, such aspects as follows may be employed. As shown in FIGS. 1c to e, for example, the supporting part 3 is mechanically scraped off as indicated by arrows, by means of a sandblasting or the like performed from a surface of the supporting part 3 opposite to the surface on which the temperature sensing section 5 is formed, while leaving the dielectric film section 4. In scraping off only a predetermined portion of the part 3, a pattern of resist or the like may be used as a blasting mask, for easily carrying out such limited area scraping.

Figure 1F:
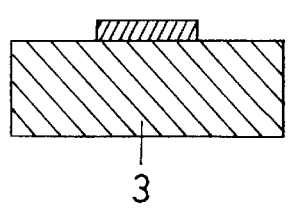
Figure 1G:
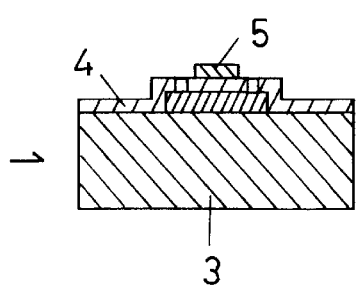
Figure 1H:
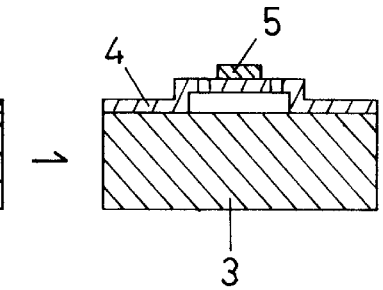
Figure 1I:
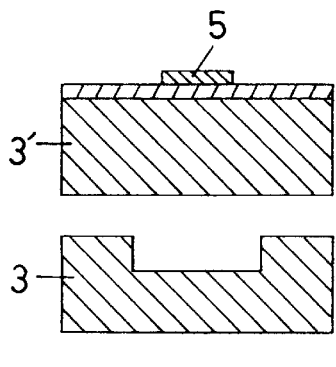
Figure 1J:
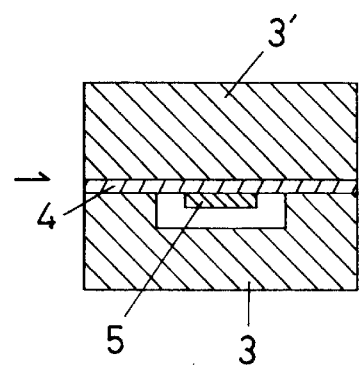
Figure 1K:
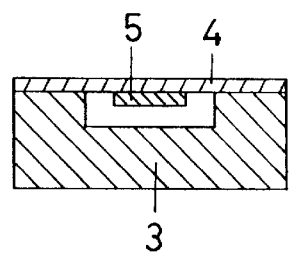
Figure 1L:
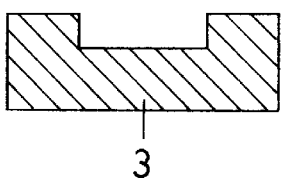
Figure 1M:
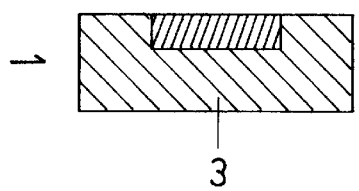
Figure 1N:
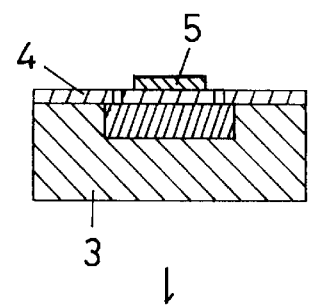
Figure 1O:
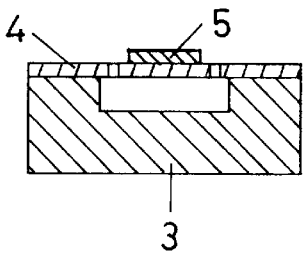

As shown in FIGS. 1f to 1h, further, a sacrificial layer eventually removed is first made through a pattern formation on the supporting part 3 at part where the temperature sensing section 5 is to be formed, the dielectric film section 4 and sensing section 5 are then formed on the part 3 and sacrificial layer, and finally the sacrificial, layer is removed. At this time, the sacrificial layer may be removed by a etchant used through etching holes. For the material of the sacrificial layer, one which can be removed by an etchant not corrosive to the materials forming the temperature sensing section 5 and film section 4 may be used. Examples of such material will be polysilicon, aluminum and the like. Further, as shown in FIGS. 1i to 1k, the arrangement may also be realized by forming the temperature sensing section 5 and dielectric film section 4 on another substrate 3', joining the substrate 3' and the sections 4 and 5 onto the supporting part 3 with the sensing section 5 positioned within a recess preliminarily made in joining surface of the supporting part 3, and finally removing the another substrate 3'. It is also possible to realize the arrangement as shown in FIGS. 1l to 1o, wherein the recess preliminarily made in the supporting part 3 is first filled with an eventually-removed sacrificial material, the dielectric film section 4 and temperature sensing section 5 are formed on this supporting part 3 with the section 5 disposed above the sacrificial material, and finally the sacrificial material is removed.

In the first and second infrared detecting elements 1 and 2 of the same structure (see also FIG. 4), the temperature sensing section 5 employs an a-SiC (amorphous-silicon carbide) thermistor formed in a so-called sandwich structure as held between a pair of electrodes consisting of Cr and of a thickness of about 1500 Å. This temperature sensing section 5 is formed in a square shape of, for example, 500 $\mu$m at one side, and each support beam 6 of the microbridge structure is made to have a width of 50 $\mu$m.

Figure 4:
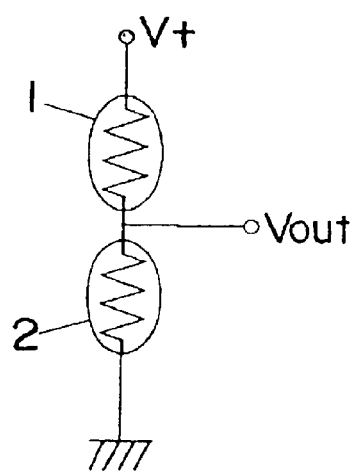
FIG. 4 shows one of circuit arrangements employable for the infrared sensor according to the present invention.
Figure 5:
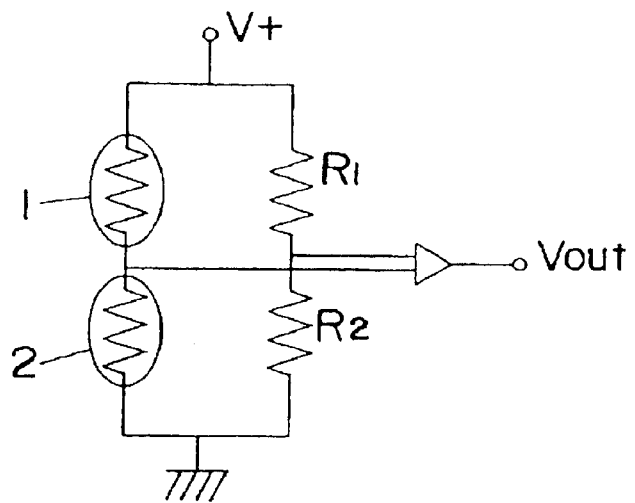
FIG. 5 shows another example of the circuit arrangement employable in the present invention.

Now, the measurement of temperature variation is enabled by, as shown in FIG. 4, connecting the respective temperature sensing sections 5 of the first and second infrared detecting elements 1 and 2 in series, applying to them a predetermined voltage V, and measuring variation in the potential Vout at junction point between them. As shown in FIG. 5, further, it may be also possible to connect a series circuit of externally fixed resistors R1 and R2 in parallel to the series circuit of the elements 1 and 2.

Figure 3:
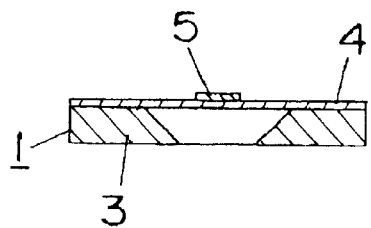
Figure 6:
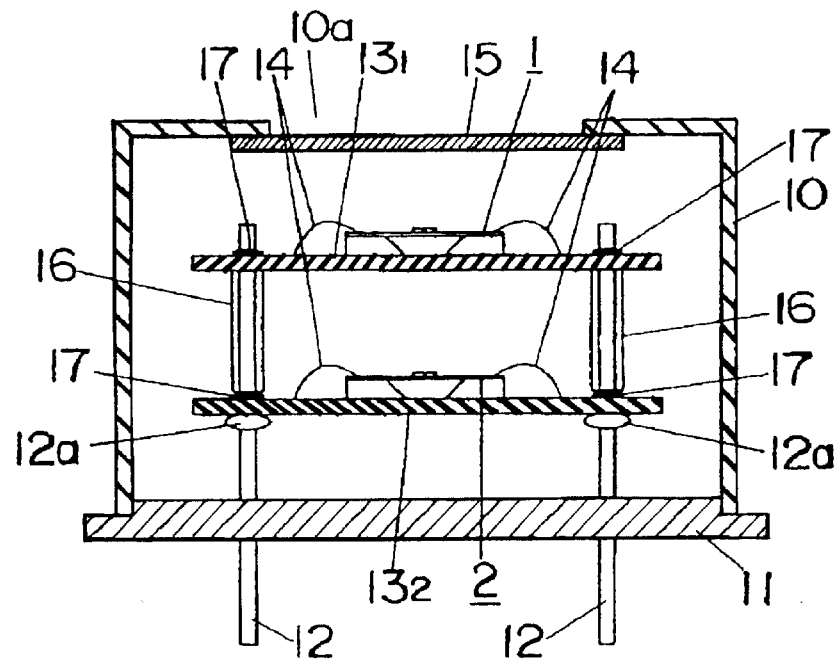
FIG. 6 shows in a schematic sectioned view an embodiment of the infrared sensor according to the present invention.

In FIG. 6, there is shown an embodiment of the infrared sensor according to the present invention, in which sensor the first infrared detecting element 1 for the infrared detection and the second infrared detecting element 2 for the temperature compensation are respectively of such structure as shown, for example, in FIG. 3. These first and second infrared detecting elements 1 and 2 are respectively die-bonded to each of printed wiring boards $13_1$ and $13_2$ on which wire-bonding wires are formed, the boards forming the supporting part 3, and the elements 1 and 2 are connected through wires 14 to the respective wires on the printed wiring boards $13_1$ and $13_2$.

On the other hand, a container comprises a generally cylindrical cap 10 and a stem 11 secured as welded or the like to an axial end opening of the cap 10 to close the same, whereas the other axial end of the cap 10 is provided with an incident window 10a which is closed by an infrared transmitting filter 15. Pins 12 acting as electrodes are fixed to the stem 11 as passed therethrough, and these pins 12 are inserted into through holes (not shown) formed in the printed wiring boards $13_1$ and $13_2$ and are fixed thereto as adhered to the boards through conductive paste 17 for electric conduction. The printed wiring board $13_2$ on which the second infrared detecting element 2 is mounted is disposed on lower side (the side of the stem 11) within the container, and ceramic-made spacers 16 are fitted over the pins 12 for keeping a predetermined space between the two printed wiring boards $13_1$ and $13_2$. Further, the printed wiring board $13_1$ on which the first infrared detecting element 1 is mounted is disposed on upper side (the side of the incident window 10a) within the container. The pins 12 have flanges 12a of a larger diameter than the through hole in the printed wiring board $13_2$ so that the board can be positioned at a predetermined height from the stem 11.

Further, the respective printed wiring boards $13_1$ and $13_2$ are fixed to the pins 12 with their mounting surfaces of the infrared detecting elements 1 and 2 disposed on the upper side. By disposing thus the element mounting surfaces of the respective printed wiring boards $13_1$ and $13_2$ on the same side, it is made possible to prevent the first and second infrared detecting elements from being damaged upon fixing the pins 12 to the printed wiring board $13_1$ and $13_2$.

Accordingly, in the present embodiment, the disposition of the printed wiring board $13_1$ carrying the first infrared detecting element 1 for the infrared detection on the upper side of the second infrared detecting element 2 causes the infrared incident from the exterior into the incident window 10a through the infrared transmitting filter 15 (which shall, be referred to as "incident infrared" in the followings) to be incident upon the first infrared detecting element 1 only but to be prevented from reaching the second infrared detecting element 2 as shielded by the printed wiring board $13_1$, and the second infrared detecting element 2 for the temperature compensation can be prevented from being influenced by the incident infrared. It is also enabled to utilize the printed wiring board $13_1$ carrying the first infrared detecting element 1 concurrently as means for shielding the infrared with respect to the second infrared detecting element 2, whereby it is made unnecessary to separately provide such means as the known infrared shielding plate, and any restriction of the angle of view of the first infrared detecting element 1 as well as any remarkable change in the sensitivity according to the angle of view can be eliminated from occurring. As a result, it should be appreciated that, in cooperation with the disposition of the second infrared detecting element 2 for the temperature compensation in the same container as the first infrared detecting element, any deterioration in the detecting precision due to the variation in the ambient temperature can be prevented at low costs, without any hindrance to the compensation for the ambient temperature.

Figure 7:
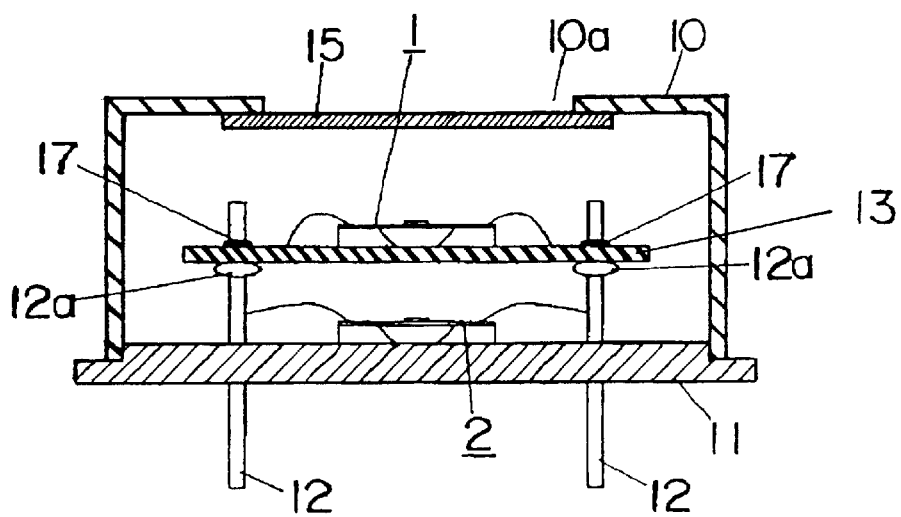
FIGS. 7–17 are schematic sectioned views showing other embodiments of the infrared sensor according to the present invention.

Instead of the mounting of the second infrared detecting element 2 for the temperature compensation to the printed wiring board $13_2$, the particular element may be die-bonded directly to the stem 11 forming the container, as shown in FIG. 7, in which event the printed wiring board $13_2$ as well as the spacers 16 may be made unnecessary, and the manufacturing costs can be further reduced.

Figure 8:
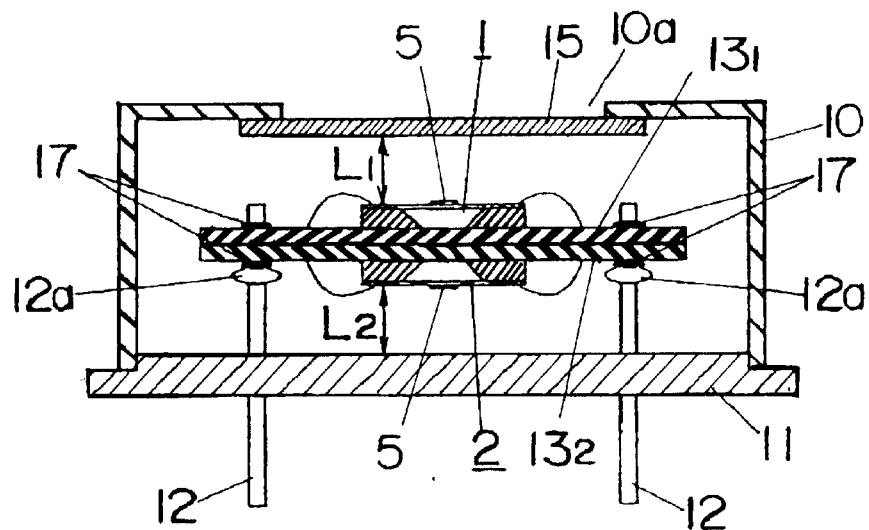

Another embodiment of the present invention is shown in FIG. 8, in which the same basic constituents as those in FIG. 6 are denoted by the same reference numerals with their description omitted and only characteristic points shall be described in the followings.

In the present embodiment, the second printed wiring board $13_2$ carrying the second infrared detecting element 2 for the temperature compensation is fixed to the pins 12 with the surface carrying the element faced to the lower stem side, while the first printed wiring board $13_1$ carrying the first infrared detecting element 1 for the infrared detection is placed intimately on the second board with the surface carrying the first element faced to the incident window 10a, both boards are disposed substantially in the center of the container so that a gap L1 between the first infrared detecting element 1 and the infrared transmitting filter 15 and a gap L2 between the second infrared detecting element 2 and the stem 11 will be substantially equal to each other (L1≈L2), and a layer of a lower reflectance material such as a black paint than the material of the cap 10 and stem 11 is provided on inner walls of the cap 10 and stem 11 in order to prevent the incident infrared from reaching the second infrared detecting element 2 as reflected on the inner walls.

Since other infrared than that incident through the incident window 10a is also incident on the first infrared detecting element 1 due to radiation or the like from the cap 10 and stem 11 of the container, the disposition of the second infrared detecting element to face the innermost wall of the container for rendering the other infrared due to the radiation or the like form the container to be incident also on the element 2 with the same intensity allows the intensity of the other infrared incident on both infrared detecting elements 1 and 2 than the incident infrared from the incident window 10a to be substantially equal, whereby any influence due to the infrared received from the inner walls of the container can be compensated for and the detecting precision can be prevented from being deteriorated by the ambient temperature change.

In the present embodiment, further, the temperature sensing section 5 in each of the first and second infrared detecting elements 1 and 2 is constituted by a thermistor which causes a temperature variation to occur with its own heat generation, but a driving of the temperature sensing section 5 with a constant voltage or current is so performed that the own heat release value will vary in response to variation in the resistance value of the thermistor due to the variation in the ambient temperature. To this own heat release value, the heat conductance relying on heat insulating structure of the infrared detecting elements 1 and 2 is determinative, and this heat conductance is determined by a sum of the heat conductance of the supporting diaphragm or microbridge for the temperature sensing section 5 and the heat conductance of ambient gas. Here, the heat conductance of the ambient gas is largely influenced by the gap L1 between the first infrared detecting element 1 and the filter 15 and the gap L2 between the second infrared detecting element 2 and the stem 11, and any difference between these gaps causes a difference to arise in the heat conductance, whereby a difference is caused to arise in the own heat release value to render a heat difference to occur in the temperature sensing section 5.

At this time, in the present instance, the heat conductance can be made substantially equal with respect to both temperature sensing sections 5 of the first and second infrared detecting elements 1 and 2 by substantially equalizing both gaps L1 and L2, and the detecting precision can be prevented from being deteriorated due to the change in ambient temperature by rendering any temperature rise due to the own heat generation at the temperature sensing sections 5 to be in conformity to each other. Further, because of these respects, it is enabled to realize an infrared sensor further higher in the detecting precision than the embodiment of FIG. 6.

Further, because of the provision of the layer of lower reflectance than the cap 10 and stem 11 by the application of black paint on the inner walls of the container, it is enabled to prevent the infrared reflecting on the inner walls of the container even in the case of wide angle of view, to prevent unnecessary infrared from being incident on the second infrared detecting element 2 for the temperature compensation, and, consequently, to realize an infrared sensor of a wide angle of view.

Figure 9:
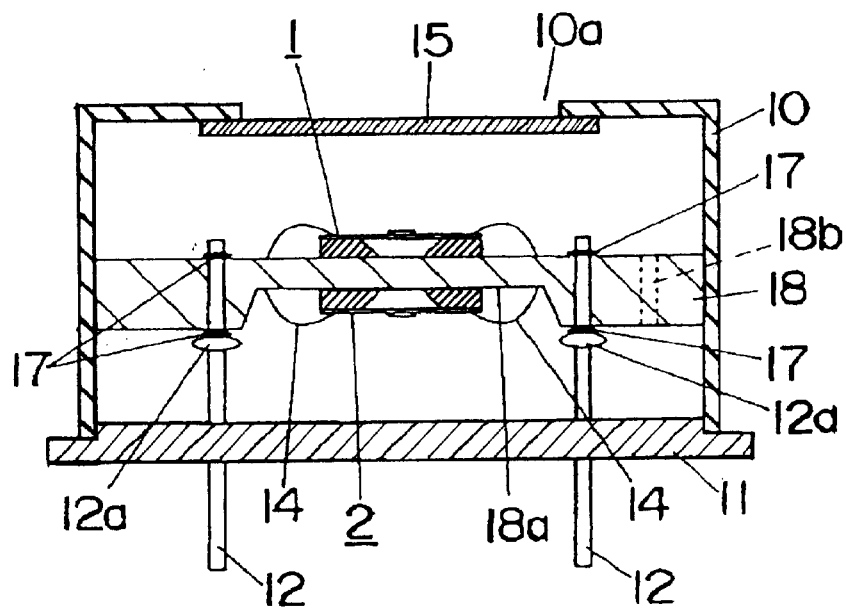

In another embodiment shown in FIG. 9 of the present invention, the first and second infrared detecting elements 1 and 2 are respectively mounted onto each of both surfaces of a single printed wiring board 18 having the printed wirings on the both surfaces, while the second infrared detecting element 2 is die-bonded to a recess 18a formed in the surface facing the stem 11 and the board 18 is brought into contact at least at peripheral edges with the inner walls of the cap 10.

By mounting in this way the first and second infrared detecting elements 1 and 2 respectively onto each of front and rear surfaces of the single printed wiring board, it is enabled to reduce the manufacturing costs by the fact that only one printed wiring board 18 is required for mounting the two elements 1 and 2, and that required mounting work is simplified. It is also possible to render the recess 18a made in the printed wiring board 18 to have a depth enough for keeping the second infrared detecting element 2 in the recess 18a as well as the wires 14 not to project out of the rear, mounting surface of the board 18, whereby, when the mounting is made first for the second infrared detecting element 2 in the recess 18a on the rear surface and thereafter for the first infrared detecting element 1 onto the other front surface of the board 18, the second infrared detecting element 2 mounted initial can be prevented from being damaged by any jig or the like that may hit the element 2 upon mounting later the first infrared detecting element 1.

Further, since the printed wiring board 18 is brought into contact at the peripheral edges with the inner walls of the cap 10 of the container, the board 18 is improved in the ability of follow-up to the ambient temperature, the first and second infrared detecting elements 1 and 2 are made thereby to well follow the ambient temperature, and the detecting precision can be improved by achieving the temperature compensation with the ambient temperature precisely monitored.

In the present embodiment, further, a gas communicating hole 18b is made as passed through the printed wiring board 18, and Xe gas of a low heat conduction is sealed in the container. In substituting the low heat conduction gas for air inside the container for improving the sensitivity or in sealing the interior of the container by drawing a vacuum, therefore, it is made easier to discharge the gas in a space partitioned by the printed wiring board 18 on upper side thereof through the gas communicating hole 18b made in the board 18, and there arises an advantage that an improvement in the productivity as well as a reduction in the manufacturing costs can be attained.

In the embodiment of FIG. 9, other constituents are the same as those in the embodiment of FIG. 6 and are denoted by the same reference numerals as those used in FIG. 6.

Figure 10:
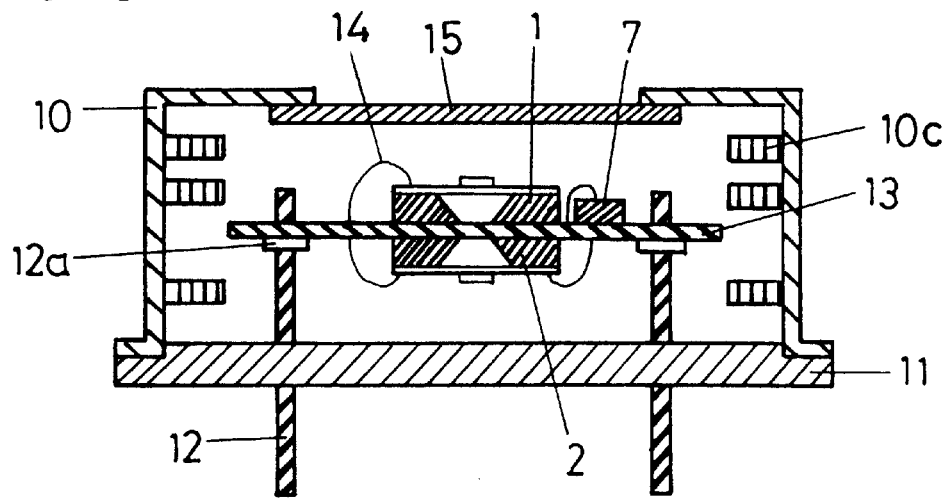

In FIG. 10, another embodiment according to the present invention is shown, in which the stem 11 of the container is molded integral with the pins 12 passed through the stem, and the short cylindrical cap 10 made of a metal, for example, is fitted over one front surface of the stem to be closed by the latter at one end opening, to define the space between them. The other end opening is closed by the infrared transmitting filter 15.

Within the space and on top ends of the pins 12 erected from the stem 11, the printed wiring board 13 is secured, and the infrared detecting element 1 and a thermistor 7 as a contact type temperature sensor for measuring the temperature of the element 1 are mounted on the board 13. Here, the pins 12 may be provided to act also as output terminals for signals of the element 1 and thermistor 7. Further, the cap 10 defining the interior space in conjunction with the stem 11 is provided on the inner surfaces with thin heat radiating fins 10c.

With the provision of the heat radiating fins 10c, further, the time constant at which the temperature of the cap 10 coincides with the temperature of the interior space defined by the cap 10 and stem 11 can be made smaller, the temperature of the infrared detecting element 1, thermistor 7 as a temperature detecting means, cap 10 and stem 11 can be quickly stabilized even in the circumstances where the ambient temperature is apt to vary, and the temperature can be measured at a high precision. Further, with the temperature of the infrared detecting element thus enabled to be measured by means of the thermister, it is made possible to correct any error in output signals occurring due to the ambient temperature variation, and the detecting precision can be further elevated.

Since the infrared detecting element 1 and thermistor 7 in the foregoing embodiments of FIGS. 9 and 10 are mounted on the single printed wiring board 13, further, they vary at the same temperature gradient, so as to be able to elevate the detecting precision even in a state where the variation in the ambient temperature occurs.

Figure 11:
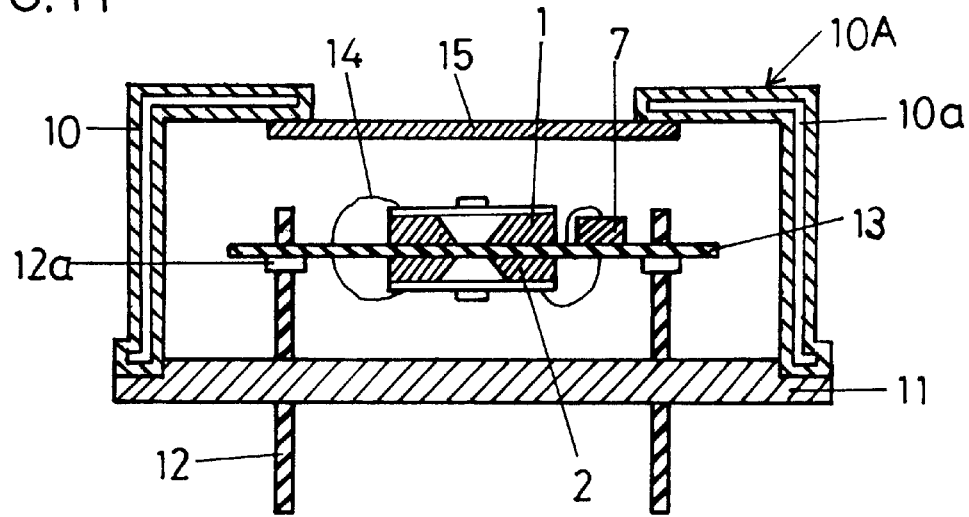

In another embodiment shown in FIG. 11 of the present invention, the cap 10 in the embodiment of FIG. 10 is replaced by a cap 10A made with two metal members joined to be a double structure having an interior gap 10a filled with air.

While in the present embodiment the interior of the cap 10A is made to be the air layer 10a, the same is not required to be limited thereto but the interior may be filled with other gas or may even be drawn a vacuum.

Normally, the cap 10A and stem 11 are different in the heat capacity due to the difference in the thickness so that, in an event of variation in the ambient temperature, the temperature variation is apt to occur initially on the side of the cap 10A, but the present embodiment employing the cap 10A of the double structure having in the interior the air layer 10a is capable of moderating the temperature fluctuation in the inner wall surface of the cap 10A, so that the infrared flux from the inner wall surface of the cap 10A and stem 11 to the infrared detecting elements 1 and 2 will be substantially identical, and the detecting precision can be improved. Further, as the temperature fluctuation in the space defined by the cap 10A and stem 11 can be moderated, the temperature fluctuation at the infrared detecting elements 1 and 2 and thermistor 7 can be also moderated, so that any difference in the temperature between these elements can be minimized to render the detecting precision more excellent.

In the embodiment of FIG. 11, on the other hand, it is also possible to employ a vacuum pressure arrangement with the interior space of the cap 10 and stem 11 drawn a vacuum preferably to be below 1 Pa. In this case, the thermal conduction from the cap 10 and stem 11 to the infrared detecting elements 1 and 2 and thermister 7 is remarkably reduced even upon change in the ambient temperature, so as to relieve the temperature fluctuation, accordingly any temperature difference is less caused to occur between these constituents, and the detecting precision can be further improved.

Other constituents of this embodiment are the same as those in the embodiment of FIG. 10, and the same constituents as those shown in FIG. 10 are denoted in FIG. 11 by the same reference numerals as used in FIG. 10.

Figure 12:
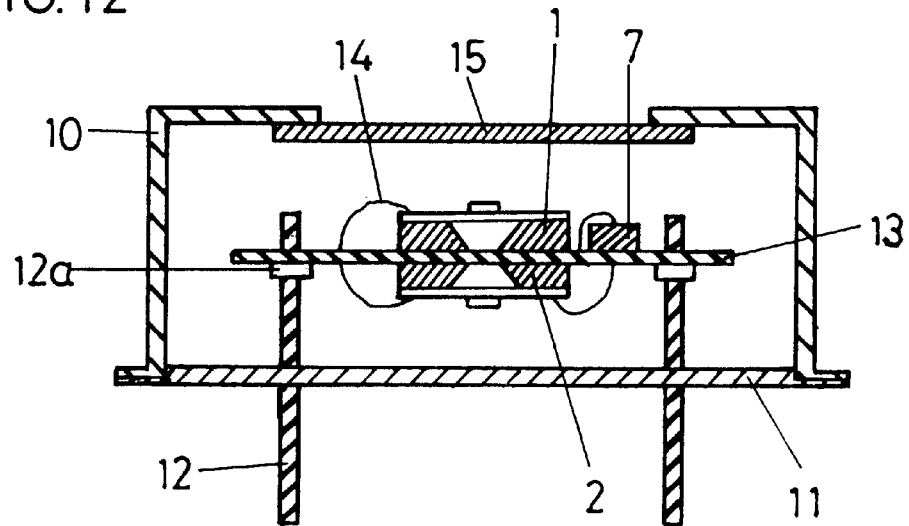

In another embodiment shown in FIG. 12 of the present invention, the container is constituted similarly with the stem 11 molded integrally with the pins 12, and the short cylindrical cap 10 a bottom end opening of which is closed by the stem 11 to define an interior space, while the top end of the cap 10 is formed to have the incident window closed by the infrared transmitting filter 15.

Within the interior space defined by the cap 10 and stem 11, the infrared detecting element 1 and the thermistor 7 as the contacting type temperature detecting element for measuring the temperature of the infrared detecting element 1 are mounted on the stem 11, and the pins 12 are also acting as the signal output terminals of the element 1 and thermistor 7.

As a distinguishing feature here, the cap 10 and stem 11 are formed to have substantially the same thickness.

In the present embodiment, therefore, the cap 10 and stem 11 can be made to have an identical, or the same level of the heat capacity by the same thickness, so that there arises no uneven temperature variation as the same temperature variation takes place in the cap 10 and stem 11 even upon variation in the ambient temperature, the infrared flux from the inner wall surface of the cap 10 and stem 11 to the respective infrared detecting elements 1 and 2 can be made substantially identical, and the detecting precision can be improved.

Figure 13:
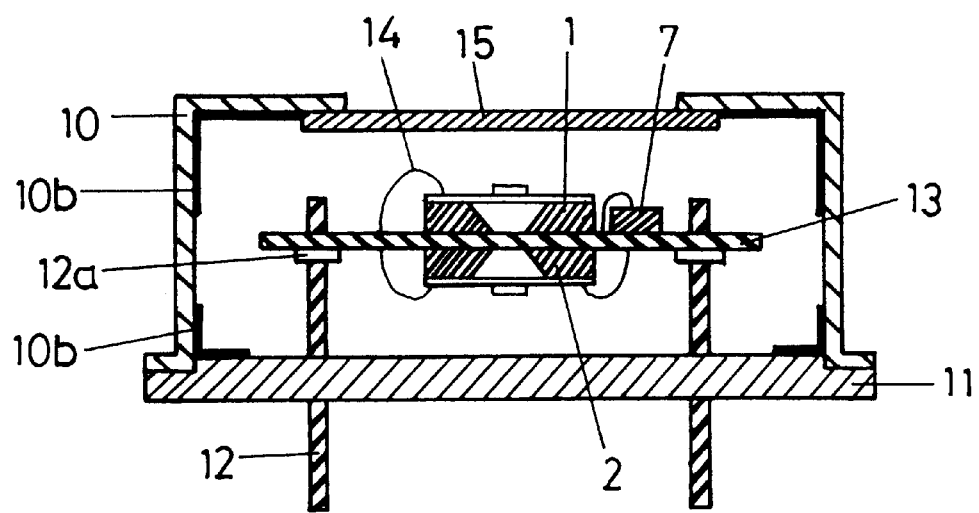

In another embodiment shown in FIG. 13, in contrast to the embodiment of FIG. 10, such paint 10*b* of which the radiant emissivity is preliminarily known as the black paint is applied to parts of the inner walls of the cap 10 and stem 11 which are included in the angle of view of the infrared detecting elements 1 and 2. In the present instance, the infrared radiant emissivity is made constant on the inner surface of the cap 10 and stem 11 included in the angle of view of both elements 1 and 2, the infrared flux from the inner surface to the elements 1 and 2 will be made substantially identical, and the detecting precision can be improved.

In the embodiment of FIG. 13, further, the paint 10*b* may be replaced by a use or execution of a material for the whole or for surface layer or of a surface treatment with respect to the cap 10 and stem 11 and attaining the same effect as the paint 10*b*.

Other constituents of the present embodiment are the same as those in the embodiment of FIG. 10, and the same constituents are denoted in FIG. 13 by the same reference numerals as those in FIG. 10.

As another embodiment, the black paint 10*b* in FIG. 13 is replaced by a plating of metal or the like to attain a lower radiant emissivity. In this case, the lower radiant emissivity at the inner walls of the cap 10 and stem 11 at least at portions included in the angle of view of the infrared detecting elements 1 and 2 renders the infrared flux from the inner walls of the cap 10 and stem 11 to the elements 1 and 2 to be small, enough to be substantially the same even when a temperature difference arises between the cap 10 and the stem 11 due to any variation in the ambient temperature, and the detecting precision can be improved. In this case, it is also preferable to attain a mirror finish at the surface of the cap 10 and stem 11.

Figure 14:
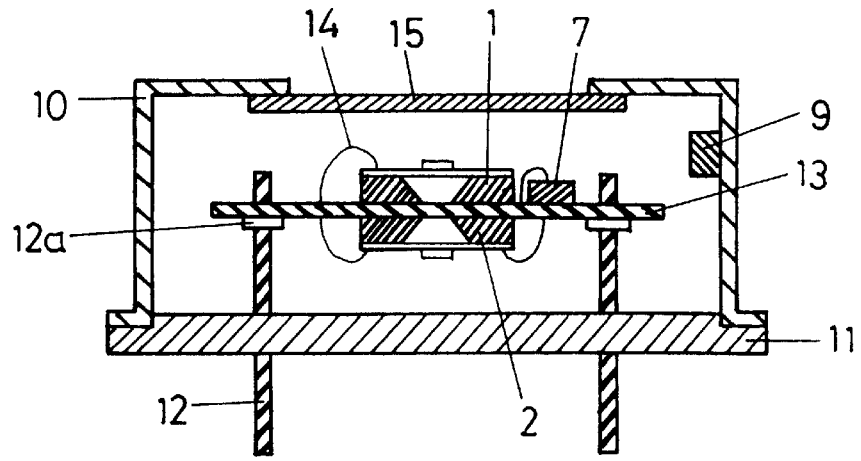

In another embodiment of the present invention as shown in FIG. 14, a further thermistor 9 is provided as adhered to an inner wall of the cap 10, in contrast to the embodiment of FIG. 10. In this case, it is made possible to predict an extent of variation in the output of the infrared detecting element 1 due to the temperature variation of the cap 10, by measuring the temperature of the cap 10 by means of the thermistor 9.

Other constituents of this embodiment are the same as those in the embodiment of FIG. 10, and the same constituents are denoted in FIG. 14 by the same reference numerals as those in FIG. 10.

Figure 15:
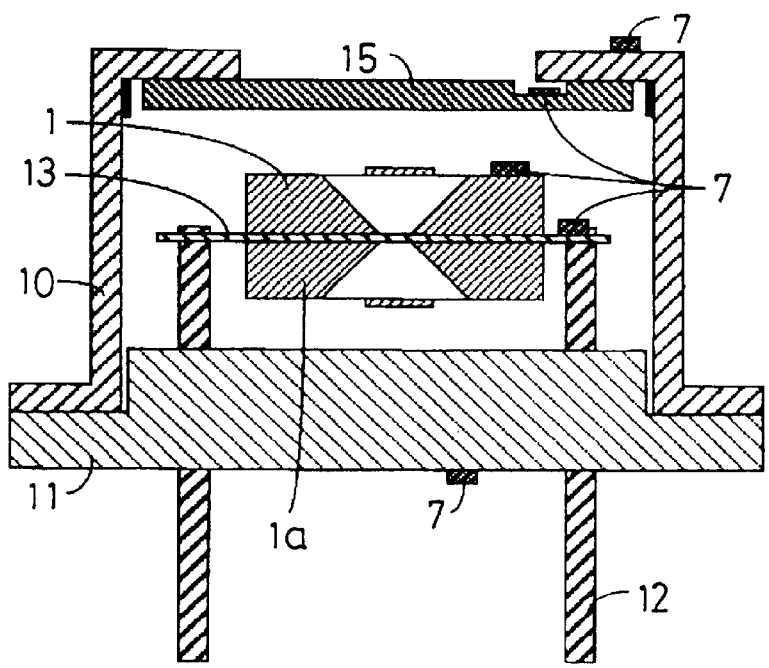

In still another embodiment of the present invention as shown in FIG. 15, there are provided a plurality of the thermistors 7 for detecting the temperature at respective portions of the cap 10, stem 11, infrared transmitting filter 15, infrared detecting element 1 and printed wiring board 13.

The calorie which is detected by the infrared detecting element 1 can be represented by a formula $$\phi_a \cdot \varphi_a (T_a^4 - T_s^4) \tag{1}$$

wherein $\phi_a$ is the ratio of the angle of view at the incident window of the cap 10, $\in_a$ is the radiant emissivity of an objective, $T_a$ is the temperature of the objective, and $T_s$ is the temperature of the infrared detecting element 1.

In an event where the ambient temperature is stable and the temperature at portions of the package within the angle of view of the infrared detecting element 1 (at the cap 10, stem 11 and infrared transmitting filter 15) coincides with the temperature of the infrared detecting element 1, the relation of incident infrared flux at the infrared detecting element to the element temperature and to the objective temperature can be obtained with the above formula (1), whereas, as the ambient temperature varies to render the temperature at the package portions in the angle of view of the element 1 to be different from the temperature of the element 1, then the infrared from the package is caused to be detected in addition to the infrared from the objective, and there occurs an error.

Here, the temperature correction factor at the package portions can be represented by a formula $$\phi_1 \cdot \in_1 (T_1^4 - T_s^4) + \phi_2 \cdot \in_2 (T_2^4 - T_s^4) + \ldots \phi_n \cdot \in_n (T_n^4 - T_s^4) \tag{2}$$

wherein $\phi_n$ denotes the ratio of the angle of view at the package portions n, $\in_n$ denotes the radiant emissivity at the package portions n, and $T_n$ denotes the temperature at the package portions n.

Now, by applying the output from the thermistors 7 to the above formula (2) and obtaining the sum or difference of the formulas (1) and (2), it is made possible to improve the detecting precision.

Figure 16:
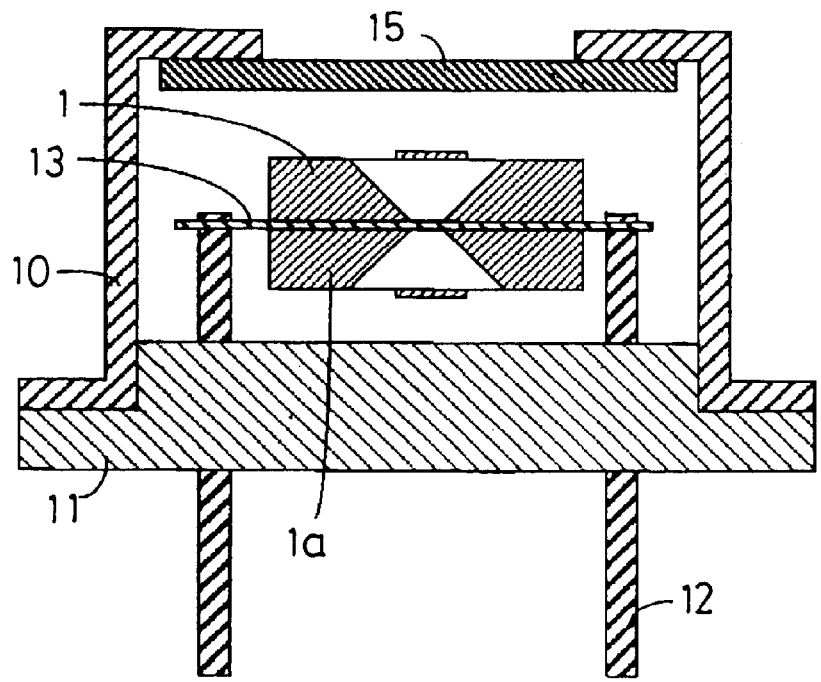

In another embodiment of the present invention as shown in FIG. 16, there is a difference from the embodiment of FIG. 10 in that, instead of the separate provision of the thermistor 7 as the temperature detecting means, the temperature of the temperature sensing section itself of one or both of the infrared detecting elements 1 and 2 is measured, for the correction of the detected signals with the thus measured temperature value. More specifically, the temperature sensing section of these infrared detecting elements is constituted by the thermistor, and the temperature of the temperature sensing section is measured by obtaining the resistance value of the thermistor. While in the foregoing formula (1) the temperature $T_s$ is denoted as that of the infrared detecting element, the infrared from the objective is to be received at the temperature sensing section in practice, and the temperature $T_s$ should be denoted inherently as that of the temperature sensing section of the infrared detecting element. When the general temperature variation is small, on the other hand, there arises no remarkable temperature difference between the temperature sensing section and the separately provided temperature detecting means, and the temperature $T_s$ may be denoted as the temperature of the infrared detecting element.

Here, in the case where the temperature difference is apt to occur between the respective parts in such event that the temperature at the respective parts of the sensor is varying due to the variation in the ambient temperature, there occurs the temperature difference between the temperature sensing section and the temperature detecting means, and it will be required, for accurate detection, to measure the temperature of the temperature sensing section in the infrared detecting element. Since in the present embodiment the temperature of the temperature sensing section itself is measured, the detection is enabled at a higher precision.

Figure 17:
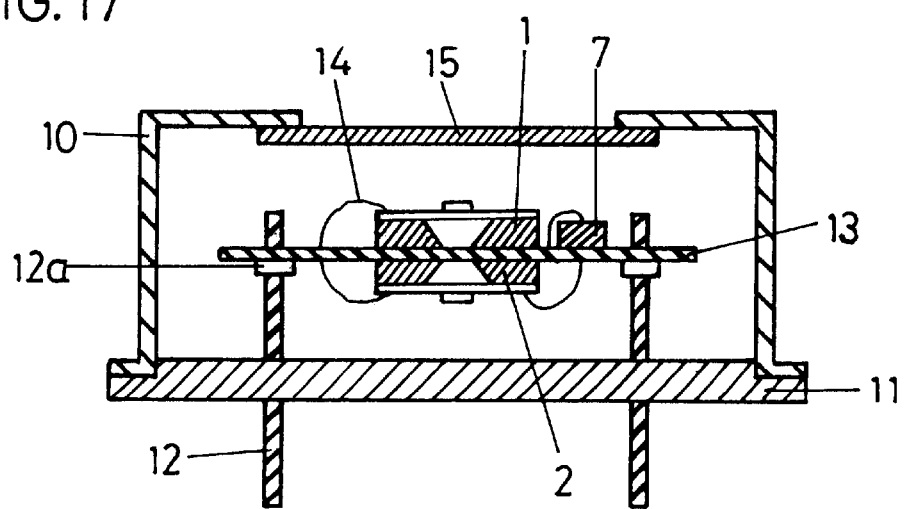

In the present invention, various design modification is possible within the scope of appended claims. In the embodiment of FIG. 14, for example, the thermistor 9 provided on the inner surface of the cap 10 may be omitted as shown in FIG. 17 to employ only the single thermistor 7 mounted on the supporting substrate 13 along with the first infrared detecting element 1, for simplifying the arrangement in adaption to the use. Further, it should be appreciated that the embodiments of FIGS. 10 through 17 are respectively capable of mutually incorporating their characteristic arrangement of another embodiment.

What is claimed is:

1. An infrared sensor comprising a container having an infrared incident window, a first infrared detecting element for infrared detection and disposed inside the container as supported by a supporting part of a substrate in opposition to the incident window, and a second infrared detecting element for temperature compensation and disposed inside the container with the infrared shielded by the supporting substrate of the first infrared detecting element from being incident on the second infrared detecting element, wherein the first and second infrared detecting elements include respectively a temperature sensing section, the temperature sensing section of at least the first infrared detecting element being supported in a non-contacting state with respect to the supporting part for the element, a temperature variation at the temperature sensing section of the first infrared detecting element is converted into an electric detection signal, and the temperature sensing section of the second infrared detecting element is substantially equalized in the heat capacity and heat conductance through ambient gas to the temperature sensing section of the first infrared detecting element.

2. The infrared sensor according to claim 1 wherein the second infrared detecting element is disposed to face in a direction opposite to the incident window.

3. The infrared sensor according to claim 1 wherein the supporting substrate has a surface on which the first infrared detecting element is supported and the other opposite surface on which the second infrared detecting element is supported.

4. The infrared sensor according to claim 3 wherein at least one of the surfaces of the supporting substrate is provided with a recess for mounting therein one of the infrared detecting elements, the recess being of a depth enough for not projecting the mounted element out of the one surface.

5. The infrared sensor according to claim 1 wherein the second infrared detecting element also includes a temperature sensing section facing opposite to the incident window, and gaps respectively between the temperature sensing section of the first infrared detecting element and the incident window and between the temperature sensing section of the second infrared detecting element and one of constituents of the container opposing to the sensing section are substantially equal to each other.

6. The infrared sensor according to claim 2 wherein the second infrared detecting element also includes a temperature sensing section facing opposite to the incident window, and gaps respectively between the temperature sensing section of the first infrared detecting element and the incident window and between the temperature sensing section of the second infrared detecting element and one of constituents of the container opposing to the sensing section are substantially equal to each other.

7. The infrared sensor according to claim 3 wherein gaps respectively between the temperature sensing section of the first infrared detecting element and the incident window and between the temperature sensing section of the second infrared detecting element and one of constituents of the container opposing to the sensing section are substantially equal to each other.

8. The infrared sensor according to claim 1 wherein the container comprises a stem and a cap, the stem includes pins for securing the supporting substrate, and the pins are provided with projections for positioning the supporting substrate.

9. The infrared sensor according to claim 1 wherein at least part of the supporting substrate is brought into contact with the container.

10. The infrared sensor according to claim 1 wherein the container comprises a stem and a cap which are of the same thickness.

11. The infrared sensor according to claim 1 wherein the interior of the container is drawn a vacuum.

12. The infrared sensor according to claim 1 which further comprises a plurality of beams for supporting the temperature sensing sections of the first and second infrared detecting elements in the non-contacting state, the beams for the first and second infrared detecting elements being mutually equalized in the heat capacity and heat conductance through ambient gas.

13. An infrared sensor comprising a container having an infrared incident window, a first infrared detecting element for infrared detection and disposed inside the container as supported by a supporting part of a substrate in opposition to the incident window, and a second infrared detecting element for temperature compensation and disposed inside the container with the infrared shielded by the supporting substrate of the first infrared detecting element from being incident on the second infrared detecting element, wherein the first infrared detecting element includes a temperature sensing section which is supported in non-contacting state with respect to the supporting part for the element, a temperature variation at the temperature sensing section of the first infrared detecting element is converted into an electric detection signal, further comprising means for measuring the temperature of at least one of the first and second infrared detecting elements and the container, a measured temperature value of which means being used for correcting the electric detection signal to render any error in the signal occurring due to change in the ambient temperature to be substantially zero.

14. The infrared sensor according to claim 13 wherein the electric detection signal is corrected by one of the radiant emissivity and the reflectance preliminarily obtained with respect to the interior of the container, and an occupying ratio of them.

15. The infrared sensor according to claim 13 wherein the temperature measuring means detects a temperature at the incident window as the temperature at a portion inside the container.

16. The infrared sensor according to claim 13 wherein the temperature measuring means detects the temperature of the temperature sensing section as the temperature of the one of the infrared detecting elements and container.

17. An infrared sensor comprising a container having an infrared incident window, the container including inner walls of a first reflectance and a coating of a material having a second reflectance that is lower than the first reflectance, a first infrared detecting element for infrared detection and disposed inside the container and supported by a supporting part of a substrate in opposition to the incident window, and a second infrared detecting element for temperature compensation disposed inside the container with the infrared shielded by the supporting substrate of the first infrared detecting element from being incident on the second infrared detecting element, wherein the first infrared detecting element includes a temperature sensing section which is supported in non-contacting state with respect to the supporting part for the element, and a temperature variation at the temperature sensing section of the first infrared detecting element is converted into an electric detection signal.

18. An infrared sensor comprising a container having an infrared incident window and an inner wall provided with heat radiating fins, a first infrared detecting element for infrared detection and disposed inside the container as supported by a supporting part of a substrate in opposition to the incident window, and a second infrared detecting element for temperature compensation and disposed inside the container with the infrared shielded by the supporting substrate of the first infrared detecting element from being incident on the second infrared detecting element, wherein the first infrared detecting element includes a temperature sensing section which is supported in non-contacting state with respect to the supporting part for the element, and a temperature variation at the temperature sensing section of the first infrared detecting element is converted into an electric detection signal.

19. An infrared sensor comprising a container having an infrared incident window, the container being formed of a pair of metal members formed to define a heat insulating gap therebetween, a first infrared detecting element for infrared detection and disposed inside the container as supported by a supporting part of a substrate in opposition to the incident window, and a second infrared detecting element for temperature compensation and disposed inside the container with the infrared shielded by the supporting substrate of the first infrared detecting element from being incident on the second infrared detecting element, wherein the first infrared detecting element includes a temperature sensing section which is supported in non-contacting state with respect to the supporting part for the element, and a temperature variation at the temperature sensing section of the first infrared detecting element is converted into an electric detection signal.

20. An infrared sensor comprising a container having an infrared incident window, a first infrared detecting element for infrared detection and disposed inside the container as supported by a supporting part of a substrate in opposition to the incident window, the container having an inner portion within sight of the first infrared detecting element that has a constant infrared radiant emissivity and a second infrared detecting element for temperature compensation and disposed inside the container with the infrared shielded by the supporting substrate of the first infrared detecting element from being incident on the second infrared detecting element, wherein the first infrared detecting element includes a temperature sensing section which is supported in non-contacting state with respect to the supporting part for the element, and a temperature variation at the temperature sensing section of the first infrared detecting element is converted into an electric detection signal.

21. An infrared sensor comprising a container having an infrared incident window, a first infrared detecting element for infrared detection and disposed inside the container as supported by a supporting part of a substrate in opposition to the incident window, the container having an inner portion within sight of the first infrared detecting element that is low in infrared radiant emissivity, and a second infrared detecting element for temperature compensation and disposed inside the container with the infrared shielded by the supporting substrate of the first infrared detecting element from being incident on the second infrared detecting element, wherein the first infrared detecting element includes a temperature sensing section which is supported in non-contacting state with respect to the supporting part for the element, and a temperature variation at the temperature sensing section of the first infrared detecting element is converted into an electric detection signal.

* * * * *